United States Patent [19]

Torp et al.

[11] 3,945,935

[45] Mar. 23, 1976

[54] SEMICONDUCTIVE METAL CHALCOGENIDES OF THE TYPE $CU_3VS_4$ AND METHODS FOR PREPARING THEM

[75] Inventors: Bruce A. Torp, White Bear Lake; Edward C. Shaffer, St. Paul, both of Minn.

[73] Assignee: Minnesota Mining and Manufacturing Company, St. Paul, Minn.

[22] Filed: Oct. 29, 1971

[21] Appl. No.: 193,701

Related U.S. Application Data

[63] Continuation-in-part of Ser. No. 707,245, Feb. 21, 1968, abandoned.

[52] U.S. Cl............ 252/62.3 V; 423/508; 423/511; 204/192; 96/1.5; 250/370
[51] Int. Cl.² ..................... C04B 35/00; H01L 3/00
[58] Field of Search................ 252/301.4 S, 62.3 V; 204/192; 423/508, 511

[56] References Cited
UNITED STATES PATENTS
2,882,192    4/1959    Wernick ....................... 252/62.3 V Primary Examiner—Oscar R. Vertiz
Assistant Examiner—Michael L. Lewis
Attorney, Agent, or Firm—Alexander, Sell, Steldt and DeLaHunt

[57] ABSTRACT

Novel semiconductive tertiary and higher order type copper-Group V transition metal chalcogenides having useful broad-band photoconductive properties are characterized by containing fewer than 100 ppm of impurities as determined by electron microprobe analysis, excluding doping agents which may be present. These materials are made e.g. by chemical vapor transport methods using the powdered chalcogenide or mixtures of stoichiometric amounts of the elements of which it is composed, with a small amount of halogen or hydrogen halide and heating the mixture in vacuum in a temperature gradient in which the highest temperature is below about 1200° C. Photoconducting devices can be made e.g. by supplying electrodes to a thin film of the material upon a dielectric substrate.

17 Claims, 1 Drawing Figure

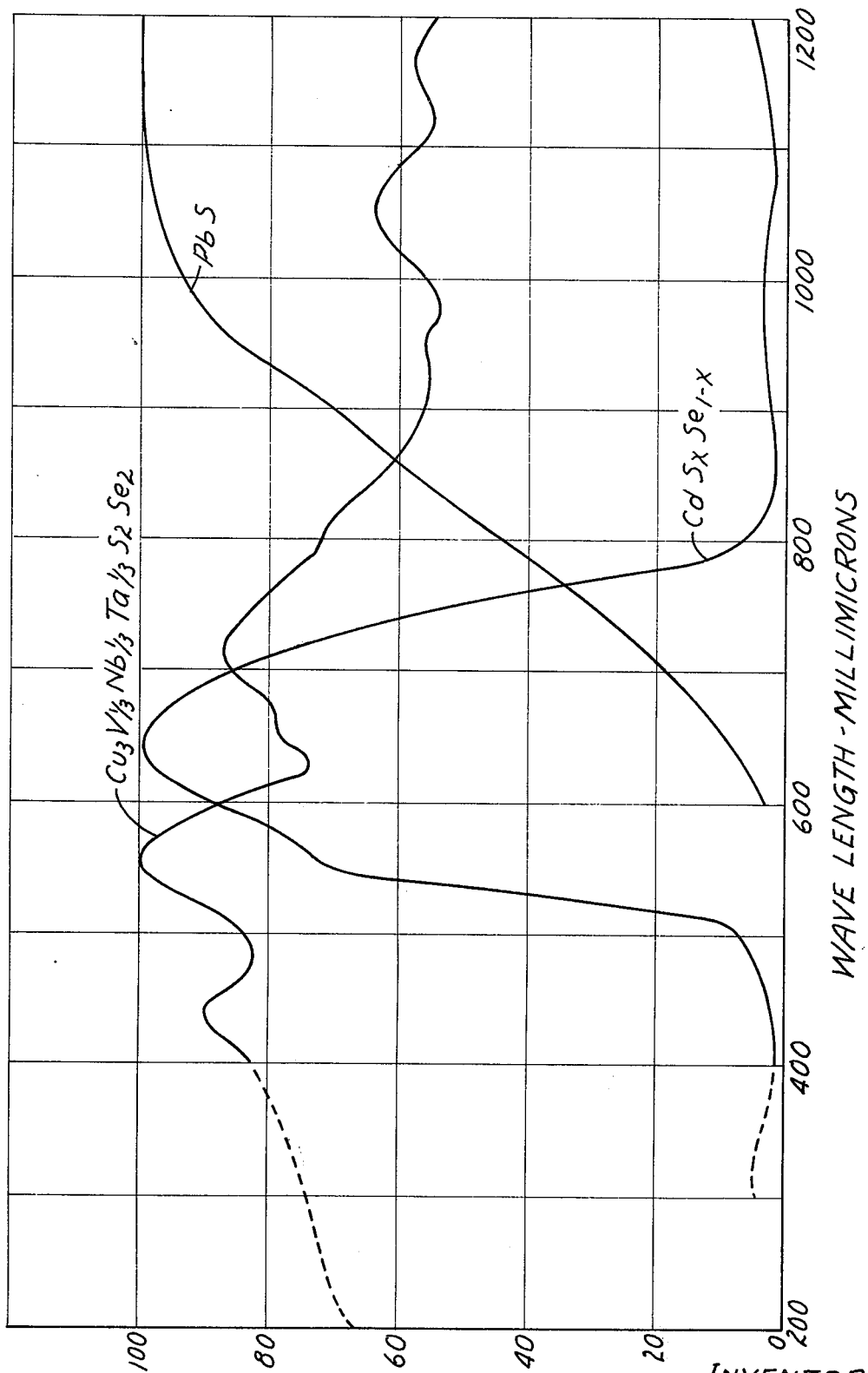

SEMICONDUCTIVE METAL CHALCOGENIDES OF THE TYPE CU₃VS₄ AND METHODS FOR PREPARING THEM

BACKGROUND OF THE INVENTION

This invention is a continuation-in-part of our prior copending application Ser. No. 707,245, filed Feb. 21, 1968 now abandoned.

This invention is in the field of copper-Group V transition metal chalcogenides and processes for making compositions of high purity containing such chalcogenides.

Heretofore, the art has appreciated that a variety of inorganic crystalline materials display semiconductive and photoconductive activity. See, for example, the reference text by R. H. Bube entitled "Photoconductivity of Solids" (published in 1960 by John Wiley and Sons, Inc., New York). So far as is known, all prior art photoconductive materials display spectral sensitivity and response over narrow ranges of the electromagnetic spectrum, e.g. cadmium sulfide is sensitive only in the visible light spectrum from about 500 to 600 millimicrons, while lead sulfide has only infrared spectral sensitivity. For some purposes it is desirable to extend or spread these characteristically limited spectral sensitivities, and this can be accomplished to only a limited extent by heavily doping the prior art photoconductive materials. However, heavy doping has the serious disadvantage of interfering with, and sometimes even destroying photoconductive sensitivity in such materials, depending upon the type and amount of particular doping agent(s) used. There has been a longfelt need in the art for photoconductive materials which would display broad-band spectral response with high sensitivity.

Chalcogenides of the type $Cu_3VS_4$, $Cu_3NbSe_4$ and the like decompose or are degraded at temperatures of the order of that at which they sinter or melt, i.e. from about 600° to 1200° C. or higher. The decomposition process can take several forms depending upon reaction conditions, but the products are always good electrical conductors. Thus, for example, such decomposition or degradation can be caused by:

1. Melting $Cu_3VS_4$ by heating to 1300° C. under twenty atmospheres argon or sulfur pressure. The following reaction proceeds almost to completion: (equations not balanced)

$Cu_3VS_4 \rightarrow CuS + CuV_2S_4 + VS$

X-ray analysis shows $CuV_2S_4$ (spinel) + Cu and V sulfides to be present.

2. Heating $Cu_3VS_4$ to 1200° C. under one atmosphere of argon or nitrogen pressure, or thermogravimetric analysis of $Cu_3VS_4$ in vacuum at 650° C.: (equations not balanced)

$Cu_3VS_4 \rightarrow Cu_2S + VS + S$

X-ray analysis shows a mixture of Cu and V sulfides to be present.

3. Sintering $Cu_3NbS_4$ and $Cu_3NbSe_4$ under carefully controlled conditions, whereupon after three grinding and sintering operations, as described in the prior art (650°–850° C.), X-ray pure material results. Microprobe analysis of a section of this material shows bery clearly that about 5–10 percent of foreign material is present, similar to 1. The compositions $Cu_2S$ or $CuS$ are definitely present, as are materials of spinel-type structure.

It should be noted that while X-ray analysis has been used to analyze for the predominant phase of a crystalline material, thus showing, in the prior art work, that the reactions employed were essentially complete in that starting materials were substantially absent, this method of analysis cannot detect the low levels of impurities required in the compounds of the invention. For these purposes, electron microprobe analysis must be employed.

While previous workers have described chemical compositions which contain compounds corresponding to the above chalcogenides (F Hulliger, Helv. Phys. Acta, 34, 379, 1961; A. E. Van Arkel and C. Crevecoeur, J. Less-Common Metals, 5, 177, 1963), none of these workers have obtained these chalcogenides in forms which were substantially free of electrically active impurities or in a form suitable for meaningful electrical studies. Because these prior art materials were sintered during the process for their preparation, they contain more stable binary compounds of copper and Group V chalcogenides, as well as a certain amount of spinel-type crystallites, which are electrically conductive, and the resulting materials do not have useful photoconductive properties. Thus, while the prior art products may have had certain electrical properties characteristic of heavily doped semiconductors, they were not significantly photoconductive, and the possibility of producing useful photoconductors or other electronic devices of this type was not recognized.

SUMMARY OF THE INVENTION

It has now been discovered that certain tertiary and higher order copper transition-metal chalcogenides which are substantially free of electrically active impurities have surprisingly broad photoconductivity ranging from the ultraviolet, through the visible, to and into the infrared regions of the spectrum.

Included within the scope of the invention are methods for producing impurity-free chalcogenides in single-crystal or polycrystalline form, as well as methods for doping such impurity-free chalcogenides with any of a plurality of agents so as to produce semiconducting materials having new and enhanced properties.

The compositions of the invention are certain copperGroup V transition metal-chalcogenides of the formula

$$Cu_3MX_4 \qquad (1)$$

wherein M is one stoichiometric equivalent containing from 1 to 3 elements selected from the group consisting of vanadium, niobium and tantalum; and $X_4$ is four stoichiometric equivalents of one or more elements or combinations of elements selected from the group consisting of oxygen, sulfur, selenium and tellurium, which contain fewer than 100 parts per million of nondopant impurities as determined by electron microprobe analysis, containing as dopants halogen of the group consisting of chlorine, bromine and iodine in amount of zero to 100 parts per million and metals of the group consisting of arsenic and antimony in amount of zero to 300 parts per million. The compositions have electrical resistivity in unilluminated condition of more than $10^5$ ohm-centimeters, and a light:dark conductivity ratio of not less than about 10:1.

The compounds of the invention have excellent stability toward high temperatures and toward atmospheric oxygen and nitrogen. Thus, even when heated as high as to 250° C., or exposed to the atmosphere at ambient temperatures in the laboratory for two years, these materials exhibit excellent retention of their photoconductive properties. This is significantly better than the behavior of known photoconductors of the lead sulfide or cadmium sulfide or selenide type, which must be e.g. encapsulated to prevent atmospheric reaction with the surface, which reaction destroys photoconductivity.

One preferred class of chalcogenides of formula 1 is highly purified ternary compounds of the formula $$Cu_3AX_4 \qquad (2)$$

wherein A is vanadium, niobium or tantalum and X is sulfur, selenium or tellurium.

These ternary compounds, when in crystalline form and having impurities fewer than 100 ppm, are characterized by having broad-band photosensitivity and a negative temperature coefficient of resistance of at least about 5 percent.

The chalcogenides of the invention are further characterized by having light-to-dark conductivity ratios of at least 10:1 when measured using a 1000 foot-candle tungsten light source with a color temperature of about 2000° K., and crystal structure of the cubic form having a $T'_d\text{-}P43m$ space group when measured using X-ray crystallography.

The compositions of the invention are also characterized by their photoresponse over a broad range of the spectrum from the ultraviolet to the infrared. This is illustrated in more detail in the accompanying drawing, which shows a spectral photoresponse curve for a typical compound of the invention, as compared with cadium sulfide-selenide and lead sulfide. The drawing is further described in Example 7 hereinafter.

The compositions of the invention also function as thermistors, in some instances having very high sensitivity, having a negative coefficient of resistance, at 25° C., greater than 5 percent.

Electron microprobe analysis indicates that the claimed chalcogenides contain fewer than 100 ppm of impurities, including within the term "impurities" compounds of some or all of the chemical elements included within the formula but of different chemical composition or crystal form, but excluding the named dopant materials. They can optionally contain as dopants zero to 100 ppm of chlorine, bromine or iodine and/or zero to 300 ppm of arsenic and antimony. All or any of these dopants can be present. The dopants are present in the crystal lattice as interstitial or substitutional components, rather than as a second phase. Preferably, dopant is present in amount of about 100 to 300 ppm. The resulting doped chalcogenide in each instance has at least the above-indicated light-to-dark conductivity ratio and the above-indicated crystal structure. The light-to-dark conductivity is usually greatly increased by the use of dopants.

When more than one element is present in the M component of formula 1, solid solution-type products are obtained. Examples of solid solution-type products of the invention include: $Cu_3(V_{1/2}Nb_{1/2})S_4$, $Cu_3VS_2Se_2$, $Cu_3(V_{1/3}Nb_{1/3}Ta_{1/3})S_2Se_2$ and $Cu_3NbSSe_2Te$. The solid solution products of this invention display, in addition to the specified light-to-dark ratio and cubic crystal structure above-indicated, variable intrinsic semiconductive properties such as more linear broad-band photoconductivity compared to the corresponding undoped compound.

To prepare the novel metal chalcogenides of the present invention having specific purity and photoconductivity characteristics, either the elements themselves or binary compounds of these elements which function as precursors for the ternary products are used as starting materials. Alternatively, impure metal chalcogenides of formula 1 may be used as starting materials. Owing to the commercial unavailability in many instances of pure binary precursors, it is generally convenient and preferred to begin with the pure elements themselves in manufacturing the claimed products.

The preferred starting materials are finely divided elements of at least 99.9 percent purity. These can be obtained from a number of commercial sources.

A plurality of methods can be used singly or in combination at various stages to prepare the claimed compounds, including chemical vapor transport (which typically yields a halide-doped material), flux growth, zone melting, sputtering and the like. These methods accomplish the requisite purification which produces products of the invention having the desired crystal structure and light-to-dark electrical conductivity ratio.

Chemical vapor transport with a halide (e.g. Cl, Br, I) is described by R. Nitsche et al., J. Phys. Chem. Solids, Vol. 21, No. 314, 199 (1961). Reactions of this type are based on the fact that transport of matter occurs in a chemical system consisting of solid and gaseous components in equilibrium when the equilibrium is made to vary locally by imposing a temperature gradient across the system.

For preparation of compositions of the invention, the transport of tertiary transition metal chalcogenide compounds is conveniently carried out by placing a sample of powdered feed material (which may be sintered compound of formula 1 or mixtures of stoichiometric amounts of elements) in one end of an outgassed vessel. After outgassing the sample, a small volume of halogen or hydrogen halide (usually 0.02 millimole of halogen or hydrogen halide per cubic centimeter of tube volume) is sublimed or condensed into the vessel and the vessel sealed off under high vacuum ($10^{-7}$ Torr). The vessel is then placed in a furnace providing a temperature gradient with the feed end of the vessel in the hotter zone. Such furnace may be an electrical resistance-heated carbon tube furnace having two adjacent zones or chambers which are separately controlled. An opening between the chambers permits the deposition end of the vessel to extend into the cooler chamber. The temperature gradient ($\Delta T$) between the furnace chambers depends upon the type of deposit desired (e.g. polycrystalline film or single crystals), the stability of the compound being transported, and the transport agent being used. The hotter end of the furnace ranges from 1000° to 700 °C., depending on the particular compound. In any event, the hotter end of the furnace is maintained at such temperature below about 1200° C. as prevents decomposition of the particular starting materials used, to avoid resultant formation of undesirable contaminants, which may also be transported. A temperature gradient ranging from about 100° to 500° C. between hotter and cooler zones is ordinarily sufficient to deposit a pure, photoconductive polycrystalline film of a compound one the inner surfaces of the cooler portion of the vessel.

For single crystal growth, there is usually required a more precise and much smaller temperature gradient which must be determined for each material, for example from 800° C. at the feed end to 789° C. at the deposition end of the vessel, for $Cu_3VSe_4$. Reaction times for vapor transport of a film or crystal vary considerably, depending upon such variables as halide pressure, temperature gradient, vessel size and geometry, and product stability. Typical process times vary from about 1 to 14 days. The products of the above reactions are always doped with up to about 100 ppm of halide which has a beneficial effect on the photoconducting properties of the compounds. Typically pure single crystals or polycrystalline films prepared by chemical vapor transport are essentially free from conductive impurities (i.e. fewer than 100 ppm) and have excellent photoconductive properties.

To prepare thin films of the materials described in this invention by sputtering, the following procedure is utilized: The selected starting materials, e.g. impure compositions of formula 1, are first hot pressed into dense pellets at about 500° C. and using 5 to 20 kilobars pressure, then sectioned into thin wafers and incorporated into the target of a commercial sputtering apparatus. To permit useful DC sputtering rates, the pellets are required to have resistivity of the order of 1 to $10^{-6}$ ohmcentimeters. The presence of small amounts of conductive impurities, as occurs when less pure starting materials are used, provides the requisite conductivity. The more pure (and therefore resistive) starting materials are purposely partially decomposed by increasing press temperature to about 1000° C. during the hot pressing operation in order to form conductive targets required for sputtering.

Zone melting of compounds of formula 1 which exhibit congruent melting points is accomplished in the usual apparatus, in which e.g. a melting zone is moved through a cylinder of the chalcogenide. The impurities concentrate in the melt. A number of passes usually must be made to achieve the requisite purity.

Sputtered thin films are coated on suitable dielectric, e.g. glass, substrates at 2000 V. using an electrode spacing of 1½ inches and 40$\mu$ argon atmosphere pressure. The substrate and the target are water cooled, and sputtering is continued for about two hours, a circular area about 1 cm. in diameter being coated through a mask. Resistance measurements indicate that most of the films thus prepared are quite pure with thicknesses on the order of about 1000 A. Those films found to have low resistance when tested are discarded. Means for making electrical connection are provided by vapor deposition of silver or gold through appropriate masks. In this way, photocells suitable for light sensing devices are made.

Suitable thin films can also be prepared by the method of radio frequency sputtering where more resistive (higher purity) starting materials can be utilized.

Methods for making doped products

The formula 1 compounds can be doped during any one of the above processes. To dope the products of the invention by sintering, the desired amount of dopant element is added to the starting materials, which are then sintered at about 600° to 750° C. In most cases this doped sintered material can then be zone melted, sputtered or vapor transported to form a doped pellet, single crystal, etc.

In the case of chemical vapor transport, the formula 1 compounds are invariably doped with small amounts of halide, e.g. up to 100 ppm. When cation-doped sintered materials are vapor transported, the resulting film or crystal is doped with both cations and anions as long as the dopant cation forms a volatile halide. This type of co-activation has led to a marked improvement in photoconducting properties of the formula 1 compounds. A possible mechanism for this co-activation enhanced photoconductivity as pertains to cadmium sulfide is described by R. H. Bube and S. M. Thomsen, J. Chem. Phys., 23, 15 (1955).

Many other state of the art techniques can be used to dope films, pellets or single crystals of the formula 1 compounds. For example, passing a suitable gas mixture over the heated materials, heat-treating the materials in powder previously doped by evaporation of a solution containing the dopant elements or compounds, sputtering or vapor coating the materials with suitable dopant elements or compounds followed by diffusion of these dopants into the materials in a subsequent heat treatment, etc., provides useful levels of doping and modifies the photoconductive properties of the compounds of the invention.

Photoconductive Elements

The compositions of this invention, whether or not they contain dopants, are useful photoconductors and can be used as semiconductive, photoconductive elements either in the form of single crystals, or films of single crystals, or in the form of polycrystalline films. These products can also be dispersed in a binder and the like, without losing photoconductive properties. Electrodes are applied by methods known to the art, i.e. evaporation, sputtering and stenciling with air drying silver, platinum or gold paste or aqueous graphite suspensions. The resulting devices are used for light control, light detection, etc.

These elements can be used in making devices for controlling other equipment, e.g. for illumination control dependent upon ambient light conditions; or for measuring ambient light as in photographic exposure meters. The infrared-sensitive materials can be employed as components in bolometers, thermal imaging systems, spectrometers and the like. Other applications based on the broad-spectrum photosensitivity of these materials will be readily apparent to those skilled in the art.

The invention is further illustrated by reference to the following examples. In the specification and these examples all parts are by weight. Spark source mass spectrometry is used for analysis to determine e.g. dopant levels of halogen, arsenic or antimony at levels of from 1 ppm to 100 ppm. Neutron activation analysis is used when analyses must be made at levels as low as 0.1 ppm. Electron microprobe analysis is used at levels of 100 ppm and above.

EXAMPLE 1

A dense photoconductive film of $Cu_3VS_4$ is prepared as follows:

One gram of powdered $Cu_3VS_4$ (prepared by sintering the elements at 750° C.) is placed in one end of an HF etched, outgassed, quartz ampoule (about 15 cm. long, 10 cc. volume). After degassing this feed material at about 200° C. for 12 hours at $10^{-7}$ Torr, 50 mg. of iodine are sublimed into the ampoule from an evacuated iodine storage vessel, and the ampoule is sealed off under vacuum. The ampoule is then placed in a two-zone furnace controlled to ±1° having a temperature gradient from 900° C. (feed end) to 600° C. (depositing end). After 5 days, the ampoule is cooled slowly to ambient temperature and removed from the furnace. The vapor deposited product of this reaction on the inner wall of the ampoule is a polycrystalline film of $Cu_3VS_4$ about 0.1 mm. thick, having an average grain size from 30 to 70 microns. Microprobe analysis shows <100 ppm of impurities and about 100 ppm of iodine present. (By varying the amount of iodine added, from 1 to 200 ppm of iodine can be included in the final product. Chlorine, bromine, HCl or HBr can also be used, in place of iodine.) The film is removed by breaking the ampoule and gently tapping the quartz sections on which the film is deposited. Sections of this film about 2/2/0.1 mm. are mounted on a glass substrate with an insulating adhesive (Duco cement), and electrodes are provided by means of colloidal graphite (Aquadag). Elements thus formed have the following photoconductive properties: dark resistivity $(\rho_D) \sim 10^{10}$ ohm-cm., photoresponse $(R_D/R_L) = 500$, response time $(\tau_R)$ <5 m sec., decay time $(\tau_F) = 20$ m sec., at 30 V. bias and using 1000 F.C. tungsten light. Qualitative spectral response is quite broad, peaking in the red portion of the visible region with useful response extending into the ultraviolet and infrared regions.

EXAMPLE 2

For comparison with the results obtained in Example 1, a sample of $Cu_3VS_4$ was prepared by heating stoichiometric quantities of pure finely divided copper, vanadium and sulfur in an evacuated sealed tube. The reactants were initially heated in an evacuated sealed tube at 750° C. for 2 weeks. The tube was broken open, and the sintered mass was ground with an agate morter and pestle and pressed into a pellet. The pellet was then sealed into an evacuated tube, and the heating process was repeated for one week. Again, the tube was broken open, and X-ray analysis showed that the product was essentially $Cu_3VS_4$ with a few weak lines attributed to CuS. This product was reground, pressed and sealed into an evacuated tube, and over a five hour period the temperature was raised from room temperature to 750° C. and held at that temperature for 12 hours. X-ray analysis of this product showed only lines attributable to $Cu_3VS_4$ (very pure). However, emission spectroscopy showed the presence of molybdenum and silicon, each in amount of 100 ppm, as impurities. Electrical measurements on a sample of this X-ray material indicated $(\rho_D)$ to be about $10^8$ ohm-cm. and $R_DR_L$ to be about 3.

EXAMPLE 3

Well-formed, cubic single crystals of $Cu_3VSe_4$ are grown by chemical vapor transport using the techniques described in Example 1. Powdered $Cu_3VSe_4$ feed (contaminated with ~5 percent binary impurities and $CuV_2Se_4$ from a previous sintering) is sealed under vacuum in a 10 cc. quartz ampoule with 50 mg. of iodine. The ampoule is placed in a 200° C. temperature gradient (1000°–800° C.) for four days and then cooled slowly to ambient temperature. Under these conditions 1 mm. single crystal cubes of $Cu_3VSe_4$ are formed on the wall of deposition end of the ampoule. The individual crystals are removed after breaking the ampoule, mounted on a glass substrate in Duco cement, and electrodes are provided on opposite sides of the crystal using airdrying silver paste. Under 1000 F.C. tungsten light and 10 V. bias the following photoconductive properties are noted: $(\rho_D) = 7 \times 10^6$ ohm-cm., $R_D/R_L = 140$, $\tau_{R,F} <1$ m sec. These crystals have appreciable spectral sensitivity from <300 m$\mu$ to >1400 m$\mu$ (the limits of the monochromator used in the measurements). Microprobe analyses indicate there are less than 100 ppm of impurities in these crystals, and less than 100 ppm of iodide which functions as a dopant.

EXAMPLE 4

A mixture consisting of 10 percent $Cu_3VS_4$ sintered feed and 90 percent $Cu_3AsS_4$ (total weight 13 g.) was intimately ground and mixed under $N_2$ to a homogeneous powder. The $Cu_3VS_4$ had been previously prepared from the elements via a two-step sintering reaction at 750°–800° C., and the $cu_3AsS_4$ has been prepared by first sintering a mixture of the elements at 750° C. followed by melting the compound at 900° C. The mixed powder was placed in an out-gassed, etched quartz ampoule, out-gassed at 150° C. and $10^{-6}$ Torr for five days and sealed off under vacuum. The ampoule was then placed at a 45° angle to the horizontal in the center of a SiC lined furnace which could be controlled to ±1°. The sample was rapidly heated to 900° C. and held at this temperature for two hours to melt the $Cu_3AsS_4$ and dissolve the $Cu_3VS_4$. A programmed slow cooling procedure was then carried out at 8.5°/hour from 900° C. to 700° C. (below the melting point of $Cu_3AsS_4$) using a Data-Trak Controller to control furnace temperature and time. The furnace was then shut down and the ampoule removed at room temperature revealing a solidified melt of $Cu_3AsS_4$ containing single crystals of $Cu_3VS_4$. The $Cu_3VS_4$ single crystals were recovered by leaching away the $Cu_3AsS_4$ with hot aqueous NaOH, $Na_2S$, NaCN mixture. The crystals were shown to be pure $Cu_3VS_4$ via X-ray and microprobe analyses, the impurity level being below 100 ppm. Photoconductance measurements on these crystals (standard electrodes and conditions) revealed broad-band photoconductivity with $(\rho_D)$ about $10^8$ ohm-cm., and $R_D/R_L = 10^2 - 10^3$.

EXAMPLE 5

Sputtered Thin Film $cu_3VSe_4$.

A pellet of $Cu_3VSe_4$ is first prepared as follows: About two grams of pure >200 mesh $Cu_3VSe_4$ are pre-pressed into a ¼ inch diameter by ¼ inch high tetrafluoroethylene cylinder contained in a lava block, capped with a lava cap and sealed in a tantalum container. The sample and container are placed inside the piston-cylinder die assembly (equipped with an internal carbon sleeve heater) of a hot pressing apparatus, and slowly heated to 550° C. while applying 17 kilobars pressure. After one-half hour the sample is removed from the die. The container is removed from the sample leaving a ¼ inch diameter by ⅛ inch high sintered pellet of theoretically dense, X-ray pure $Cu_3VSe_4$. This pellet is purposely heated above the decomposition point of $Cu_3VSe_4$ (800° C.) at 7 kilobars for one hour to render it electrically conductive. The pellet is made the target in a sputtering apparatus such as that described by G. K. Wehner, "Advances in Electronics and Electron Physics", Ed. by L. Marton, Academic Press, Vol. 7, 239 (1955), and $Cu_3VSe_4$ is sputtered onto a glass substrate adjacent to the target through a 1 cm. diameter mask at 2000 volts. After two hours it is found that the material has deposited as a coherent translucent film of 0.1 micron thickness. The film has resistance about $10^8$ ohms when pressure contacts of indium foil are positioned ¼ inch apart. This construction is very sensitive to IR radiation out to 10 microns. Qualitative tests showed the film to have about the same IR sensitivity as an indium antimonide crystal. Microprobe analysis showed stoichiometric $Cu_3VSe_4$ was present with <100 ppm of impurities.

EXAMPLE 6

Single crystals of $Cu_3VS_4$ were grown by chemical vapor transport with HBr gas using a procedure similar to that described in Example 1. About 0.5 g. of sintered $Cu_3VS_4$ feed was used and 10 cc. of HBr gas added after degassing the feed at 200° C. After heating the ampoule in a temperature gradient from 1000° C. (feed end) to 600° C. (depositing end) for 6 days, the sample was cooled slowly to ambient temperature. The vapor deposited product consisted of about 100 shiny metallic-appearing single crystal platelets and needles ~5 mm. × 0.3 mm. × 0.1 mm. X-ray and microprobe analysis showed less than 100 ppm impurities present. These bromine doped single crystals had $(\rho_D) = 10^{11}$ ohm-cm. and $R_D/R_L = 5 \times 10^4$ at 1000 F.C. tungsten light and 10 to 100 V. bias when mounted as described in Example 3. The crystals have appreciable broadband sensitivity peaking in the UV region of the spectrum (200 m$\mu$ to 350 m$\mu$). This region was examined qualitatively by exposing the crystals to radiation from a UV rich GE Marc 300/35 projection lamp with the wavelengths separated by a Jarrell-Ash 0.25 meter Ebert monochromator. It was found that $R_DR_L$ for the crystals varied from $0.5 \times 10^0$ to $1 \times 10^3$ for wavelengths from 350 m$\mu$ to 200 m$\mu$, exactly following the wavelength intensity distribution of the lamp.

EXAMPLE 7

Single crystals of the solid solution $Cu_3(V,Nb,Ta)(S,Se)_4$ (i.e. approximately $Cu_3V_{1/3}Nb_{1/3}Ta_{1/3}S_2Se_2$) were grown by chemical vapor transport with 4.4 mg. $I_2$/cc. as described in Example 3. The feed material was prepared from the elements in the stoichiometric proportions of the formula by sintering. After heating for 15 days in a 400° C. temperature gradient as described in Example 6 and slow cooling to room temperature, several hundred small cubic crystals (~1 mm. sides) had formed on the substrate portion (cooler end) of the ampoule. These crystals were shown by X-ray and microprobe analysis to be pure cubic $Cu_3(V_{1/3}Nb_{1/3}Ta_{1/3})S_2Se_2$ with a lattice constant of 5.517 A. The crystals were qualitatively shown to be very broad-band photoconductors. When exposed to white light of 1000 F.C. from a tungsten bulb and 10–100 V. bias, $(\rho_D) = 10^{11}$ ohm-cm. and $R_D/R_L = 10^2$ were found. Photoresponse versus wavelength studies were carried out by illuminating the mounted crystals with the output beam of a Bausch and Lomb 500 mm. monochromator. The source radiation was a tungsten ribbon filament incandescent lamp. The photoresponse versus wavelength data were corrected for the light intensity distribution of the lamp with a suitable computer program. In the wavelength region 300–1400 m$\mu$, the crystals were found by this method to have a minimum photoresponse of 50 percent, compared to the most intense peaks.

Referring to the drawing, the relative photoresponse curve of the material thus produced is shown over the range of 200 to 1200 millimicrons. The portion of the curve in the region extending from 200 to 400 millimicrons is qualitative because of limitations in the available apparatus which permitted accurate calibration only above 400 millimicrons. This portion of the curve is shown in dashed lines.

Photoresponse curves for cadmium sulfoselenide in a commercially available photocell of high quality, and lead sulfide, are superimposed on the curve for the copper (vanadium, niobium, tantalum) sulfoselenide. The portion of the curve for cadmium sulfoselenide in the region from 300 to 400 millimicrons is also shown in dashed lines. The curve for lead sulfide is that described in the literature.

The photoresponse of the composition of the invention is thus seen to be significant over the entire spectral region from 200 to 1200 millimicrons, as contrasted with the relatively narrow spectral response of the cadmium sulfoselenide and the response of lead sulfide in the visible and near infrared only.

EXAMPLE 8

Large single crystal needles and platelets of arsenic and iodine-doped $Cu_3VS_4$ were grown by chemical vapor transport utilizing a 200° C. temperature gradient and 50 mg. of iodine, continuing heating for five days, as described in Example 3. The feed material consisted of a 1 to 1 mixture of sintered $Cu_3VS_4$ and $Cu_3AsS_4$. The resultant crystals were shown by X-ray and microprobe analysis to be $Cu_3VS_4$ uniformly doped with 300 ppm arsenic and 1-100 ppm iodine. The photoresponse of these $Cu_3VS_4$ (As,I) crystals, mounted as described in Example 3, was noted to have $(\rho_D) = 10^{12} - 10^{13}$ ohm-cm., $R_D/R_L = 10^5$, a marked improvement as compared with $Cu_3VS_4$ crystals grown in iodine. A photoresponse versus wavelength study of the crystals showed the samples to be responsive throughout the range tested (300–1400 m$\mu$). The photoresponse spectrum was very similar to that of $Cu_3VS_4$.

EXAMPLE 9

The following representative compounds of the invention as set forth in Table I are made using the starting materials and methods of preparation, details of which are substantially the same as those described in Examples 1 and 3–8. The properties of the resulting compounds are also shown.

TABLE I

Semiconductor-Photoconductor Properties of $Cu_3MX_4$ Compounds

| Compounds | Starting Materials | Methods of Preparation | Semiconductive-Photoconductive Properties and Remarks (indium-mercury or silver paste electrodes) |
|---|---|---|---|
| $Cu_3VO_4$ | $3 Cu_2O + V_2O_5$ | Sinter at 720° C., Sputter | $\rho_D{}^e \sim 10^8$ ohm-cm., IR and Visible PC Qualitatively Observed. |
| $Cu_3VS_4$ | $3 Cu + V + 4 S$ | $CVT^a$, Sputter$^b$, Flux Growth$^c$ | $\rho_D = 10^8 - 10^{12}$ ohm-cm., $R_D/R_L{}^f = 3 \times 10^4$, $\tau_{R,D}{}^g < 100\mu$ sec., $-\alpha^h = 10\%$, Broad-band Response. |
| $Cu_3VSe_4$ | $3 Cu + V + 4 Se$ | CVT, Sputter | $\rho_D = 10^6$ ohm-cm., $R_D/R_L = 5 \times 10^2$, $-\alpha = 9\%$, Broad-band Response. |

TABLE I-continued

Semiconductor-Photoconductor Properties of $Cu_3MX_4$ Compounds

| Compounds | Starting Materials | Methods of Preparation | Semiconductive-Photoconductive Properties and Remarks (indium-mercury or silver paste electrodes) |
|---|---|---|---|
| $Cu_3VTe_4$ | 3 Cu + V + 4 Te | Sputter, Zone Melt[d] | |
| $Cu_3NbS_4$ | 3 Cu + Nb + 4 S | CVT, Sputter | $\rho_D = 10^{12}$ ohm-cm., $R_D/R_L = 10^2$, High UV Sensitivity. |
| $Cu_3NbSe_4$ | 3 Cu + Nb + 4 Se | CVT, Sputter | $\rho_D = 10^{11}$ ohm-cm., $R_D/R_L = 10^4$. Broad-band Response. |
| $Cu_3NbTe_4$ | 3 Cu + Nb + 4 Te | Sputter, Zone Melt | $\rho_D = 10^5$–$10^6$ ohm-cm., High IR Sensitivity due to Thermal Effects. |
| $Cu_3TaS_4$ | 3 Cu + Ta + 4 S | CVT, Sputter | $\rho_D = 10^{10}$ ohm-cm., $R_D/R_L = 100$, High UV Sensitivity. |
| $Cu_3TaSe_4$ | 3 Cu + Ta + 4 Se | CVT, Sputter | $\rho_D = 10^{10}$ ohm-cm., $R_D/R_L = 2 \times 10^2$ |
| $Cu_3TaTe_4$ | 3 Cu + Ta + 4 Te | Sputter, Zone Melt | |
| $Cu_3VS_2Se_2$ | 3 Cu + V + 2 S + 2 Se | CVT, Sputter | $\rho_D = 10^{10}$ ohm-cm., $R_D/R_L = 50$, Broad Band Response. |
| $Cu_3NbS_2Se_2$ | 3 Cu + Nb + 2 S + 2 Se | CVT, Sputter | |
| $Cu_9VNbTaS_6Se_6$ ($Cu_3V_{1/3}Nb_{1/3}Ta_{1/3}S_2Se_2$) | 9 Cu + V + Nb + Ta + 6 S + 6 Se | CVT, Sputter | $\rho_D = 10^{10}$ ohm-cm., $R_D/R_L = 10^2$, Very Broad-band Response. |
| $Cu_6VNbS_8$ ($Cu_3V_{1/2}Nb_{1/2}S_4$) | 6 Cu + V + Nb + 8 S | CVT, Sputter | $\rho_D = 10^{11}$ ohm-cm., $R_D/R_L = 10^2$ |
| $Cu_6NbTaS_8$ ($Cu_3Nb_{1/2}Ta_{1/2}S_4$) | 6 Cu + Nb + Ta + 8 S | CVT, Sputter | $\rho_D = 10^{11}$ ohm-cm., $R_D/R_L = 10$ |
| $Cu_3VS_4(As,I)$ | $Cu_3VS_4$ + As + $I_2$ | CVT, Zone Melt | $\rho_D = 10^{13}$ ohm-cm., $R_D/R_L = 10^5$ |
| $Cu_3VS_4(Sb,I)$ | $Cu_3VS_4$ + Sb + $I_2$ | CVT, Zone Melt | $\rho_D = 10^{10}$ ohm-cm., $R_D/R_L = 10$ |

[a]chemical vapor transport, as in Example 1
[b]deposited by sputtering, as in Example 5
[c]flux growth, as in Example 4
[d]zone melting by conventional methods
[e]$\rho_D$ - resistivity in dark after ~1–2 minutes
[f]$R_D/R_L$ - the dark-to-light resistance ratio (a measure of the photosensitivity for a given sample construction - ohmic contacts and 1000 foot candle tungsten lamp used)
[g]$\tau_{R,D}$ - the time required for a sample to increase in conductivity to ⅔ its maximum value when light is applied ($\tau_R$) or to fall ⅔ when light is shut off ($\tau_D$)
[h]$\alpha$ - temperature coefficient of resistance (a measure of the thermistor effect) $\alpha = \Delta R/Ro/\Delta T \times 100$

What is claimed is:

1. An inorganic single-phase composition characterized by having the formula unit $$Cu_3MX_4$$

wherein M is one stoichiometric equivalent containing from 1 to 3 elements selected from the group consisting of vanadium, niobium and tantalum, and $X_4$ is four stoichiometric equivalents and consists of one or more elements of the group consisting of oxygen, sulfur, tellurium and selenium; said composition being further characterized by having cubic crystal structure as shown by X-ray crystallographs, by containing fewer than 100 parts per million of non-dopant impurities as determined by electron probe analysis and by containing as dopant halogen of the group consisting of chlorine, bromine and iodine in amount of 0 to 100 parts per million and metal of the group consisting of arsenic and antimony in amount of 0 to 300 parts per million, said dopant materials being incorporated into the crystal lattice; said compounds having electrical resistivity in unilluminated condition of more than $10^5$ ohm-centimeters and having an illuminated:unilluminated conductivity ratio of not less than about 10:1 and having broad-band photoconductive properties.

2. A composition according to claim 1, containing about 100 to 300 parts per million of dopant.

3. A composition according to claim 1, containing a halogen as a dopant.

4. A composition according to claim 1, containing about 1 to 100 parts per million of iodine.

5. A composition according to claim 1, in which M is vanadium and X is sulfur.

6. A composition according to claim 1, in which M is vanadium and X is selenium.

7. a composition according to claim 1, in which M is vanadium and X is tellurium.

8. The composition $Cu_3V_{1/3}Nb_{1/3}Ta_{1/3}Se_2S_2$, according to claim 1.

9. A device adapted to the detection of radiation, comprising a crystalline composition according to claim 1, provided with electrical lead means.

10. A radiation detector according to claim 9, in which the crystalline composition is $Cu_3V_{1/3}Nb_{1/3}Ta_{1/3}Se_2S_2$.

11. A composition according to claim 1, consisting of a thin continuous film upon a dielectric substrate.

12. A radiation detector comprising a composition according to claim 11 having electrical lead means attached thereto.

13. a device according to claim 12, wherein the thin film consists essentially of $Cu_3VSe_4$.

14. A composition according to claim 1, having negative coefficient of resistance greater than 5 percent.

15. A process for preparing an inorganic single-phase composition characterized by having the formula unit $$Cu_3MX_4$$

wherein M is one stoichiometric equivalent containing from 1 to 3 elements selected from the group consisting of vanadium, niobium and tantalum, and $X_4$ is four stoichiometric equivalents and consists of one or more elements of the group consisting of oxygen, sulfur, tellurium and selenium; said composition being further characterized by having cubic crystal structure as shown by X-ray crystallographs, by containing fewer than 100 parts per million of non-dopant impurities as determined by electron probe analysis and by containing as dopant halogen of the group consisting of chlorine, bromine and iodine in amount of 0 to 100 parts per million and metal of the group consisting of arsenic and antimony in amount of 0 to 300 parts per million, said dopant materials being incorporated into the crystal lattice; said compounds having electrical resistivity in unilluminated condition of more than $10^5$ ohm-centimeters having an illuminated:unilluminated conductivity ratio of not less than about 10:1 and having broadband photoconductive properties, which comprises electrically sputtering in vacuum a pellet of composition of said formula and causing the sputtered material to be deposited upon a solid substrate.

16. A process according to claim 15, in which the substrate is a dielectric.

17. A process according to claim 15, in which the composition is $Cu_3VSe_4$.

* * * * *

UNITED STATES PATENT AND TRADEMARK OFFICE
CERTIFICATE OF CORRECTION

PATENT NO. : 3,945,935
DATED : March 23, 1976
INVENTOR(S) : Bruce A. Torp and Edward C. Shaffer It is certified that error appears in the above-identified patent and that said Letters Patent are hereby corrected as shown below:

Column 1, line 60, "+" should read -- $\pm$ --.

Column 5, line 1, "one" should read --on--.

Column 8, line 16, "cu$_3$AsS$_4$" should read --Cu$_3$AsS$_4$--.

Column 8, line 44, "cu$_3$VSe$_4$" should read --Cu$_3$VSe$_4$--.

Column 10, lines 32 and 33, "arseni-cand" should read --arsenic and--.

Column 13, line 9, the word "and" should be inserted "meters" and "having".

Signed and Sealed this

*twenty-ninth* Day of *June 1976*

[SEAL]

*Attest:*

RUTH C. MASON
*Attesting Officer*

C. MARSHALL DANN
*Commissioner of Patents and Trademarks*